US007022911B1

(12) United States Patent
Anderson

(10) Patent No.: US 7,022,911 B1

(45) Date of Patent: Apr. 4, 2006

(54) APPARATUS AND METHOD FOR PROVIDING ELECTROSTATIC DISCHARGE PROTECTION

(75) Inventor: Robert Anderson, Cumming, GA (US)

(73) Assignee: L3 Communications Corporation, New York, NY (US)

(*) Notice: Subject to any disclaimer, the term of this patent is extended or adjusted under 35 U.S.C. 154(b) by 0 days.

(21) Appl. No.: 10/955,208

(22) Filed: Sep. 30, 2004

(51) Int. Cl.
*H05K 9/00* (2006.01)

(52) U.S. Cl. .............................. 174/35 MS; 174/35 R

(58) Field of Classification Search ........... 174/35 MS, 174/35 R; 361/800, 816, 818

See application file for complete search history.

(56) References Cited

U.S. PATENT DOCUMENTS

| | | | | |
|---|---|---|---|---|
| 3,206,536 | A * | 9/1965 | Goodloe | 174/35 GC |
| 4,762,966 | A | 8/1988 | Kosanda | |
| 5,160,806 | A | 11/1992 | Harada et al. | |
| 5,202,536 | A * | 4/1993 | Buonanno | 174/35 GC |
| 6,080,930 | A | 6/2000 | Lommen et al. | |
| 6,188,014 | B1 * | 2/2001 | Richard et al. | 174/35 R |
| 6,462,960 | B1 * | 10/2002 | Watanabe | 361/816 |
| 6,784,363 | B1 * | 8/2004 | Jones | 174/35 GC |

* cited by examiner

*Primary Examiner*—Dean A. Reichard
*Assistant Examiner*—Adolfo Nino
(74) *Attorney, Agent, or Firm*—Gardner Groff Santos & Greenwald P.C.

(57) ABSTRACT

Embodiments of the invention include an apparatus and method for providing protection from electrostatic discharge (ESD) for electrically conducting members, such as conductive display panels, including display panels used in avionics. The ESD apparatus includes an electrical conductor, a first adhesive element adhered to a first or top surface of the electrical conductor, and a second adhesive element adhered to a generally opposing second or bottom surface of the electrical conductor. Portions of the electrical conductor protrude through the first adhesive element and the second adhesive element to make electrical contact with the electrically conducting members when the ESD apparatus is interfaced therebetween. Thus, the ESD apparatus provides an electrostatic discharge path from a display panel to its support frame through the electrical conductor portion of the ESD apparatus. Also, the adhesive elements allow for the ESD apparatus to be rapidly and securely attached between the conducting members, without the need for additional thermal or mechanical processing steps.

19 Claims, 3 Drawing Sheets

APPARATUS AND METHOD FOR PROVIDING ELECTROSTATIC DISCHARGE PROTECTION

BACKGROUND OF THE INVENTION

1. Field of the Invention

The invention relates to apparatus and methods that provide protection from electrostatic discharge (ESD). More particularly, the invention relates to apparatus and methods that provide protection from electrostatic discharge in display systems, such as avionics display systems.

2. Description of the Related Art

In electronic systems, many devices have been developed to provide protection from electrostatic discharge (ESD). Electrostatic discharge, which is the transfer of charge between bodies at different electrical potentials, can alter the electrical characteristics of electronic devices and components, or even degrade or destroy their normal operation, causing equipment malfunction and failure. Therefore, it is important to control the discharge static electricity buildup from such electronic devices and their components.

One manner to provide ESD protection in various electronic devices is to create an electrically conductive path between the device and its conductive frame or support member to allow for electrostatic discharge from the device to the frame. For example, in electronic display systems, such as those used in avionics and in military applications, an electrically conductive gasket (an ESD gasket) or other interface apparatus is secured between an electrically conductive display panel and its electrically conductive support structure to provide ESD protection for the display panel. In such display systems, ESD protection is crucial to maintaining proper operation of the displays.

Conventionally, ESD gaskets are configured as wires or other conductors embedded in a foam or rubber compound, which typically is then clamped between the conductive display panel and its conductive frame. Another type of conventional ESD gasket is made of fabric strips or other non-conductive substrates that are wrapped or coated with conductive material, such as conductive strips. Yet another conventional ESD gasket is a spring finger gasket, made of beryllium and/or copper, that often is attached between the display panel and its frame.

However, conventional ESD gaskets do not provide a sufficiently low resistance and/or a sufficiently secure conductive bond between the conductive structures. For example, many conventional ESD gaskets have difficulty in establishing and maintaining relatively low impedances at the mating surfaces of the conductive structures because of the relatively large pressures that are needed to maintain solid electrical contact, especially when both mating surfaces are planar surfaces. Conventional springs, clips, clamps, screws and other mechanical fastening means for maintaining contact between the ESD gaskets and their conductive mating surfaces often do not keep the EDS gaskets secured between the mating surfaces. Also, such mechanical fastening devices constitute additional component parts that must be maintained in inventory, and the use of such parts tends to increase assembly time and overall cost. However, less burdensome means, such as conductive adhesives, do not allow direct contact between the ESD gaskets and their conductive mating surfaces. Thus, since the electrical resistance of such conductive adhesives is much greater than the resistance of the ESD gasket, the electrical conductance of the path between the mating surfaces through the ESD gasket is greatly reduced, thereby reducing the effectiveness of the ESD gasket to control ESD.

Therefore, it would be desirable to have an interface apparatus like an ESD gasket to provide and securely maintain a relatively low resistance path between two conductive surfaces, such as in a conductive panel and its support structure in a display system.

SUMMARY OF THE INVENTION

Briefly described, in one form embodiments of the invention comprise an apparatus and method for providing protection from electrostatic discharge (ESD) for electrically conducting members, such as conductive display panels, including display panels used in avionics and military applications. The ESD apparatus includes an electrical conductor, a first adhesive element adhered to a first or top surface of the electrical conductor, and a second adhesive element adhered to a generally opposing second or bottom surface of the electrical conductor. According to embodiments of the invention, portions of the electrical conductor protrude through the first adhesive element and the second adhesive element in such a way that, when the ESD apparatus is interfaced between electrically conducting members, the protruding portions of the electrical conductor make electrical contact with the mating surfaces of the electrically conducting members. Such electrically conducting members can include electrically conductive display panels and their electrically conductive supports or support frames. Thus, according to embodiments of the invention, the ESD apparatus provides an electrostatic discharge path from the display panel to its support frame through the electrical conductor portion of the ESD apparatus. Also, the adhesive elements allow for the ESD apparatus to be rapidly and securely attached between the conducting members, with no additional thermal or mechanical processing steps needed.

Figure 4A:
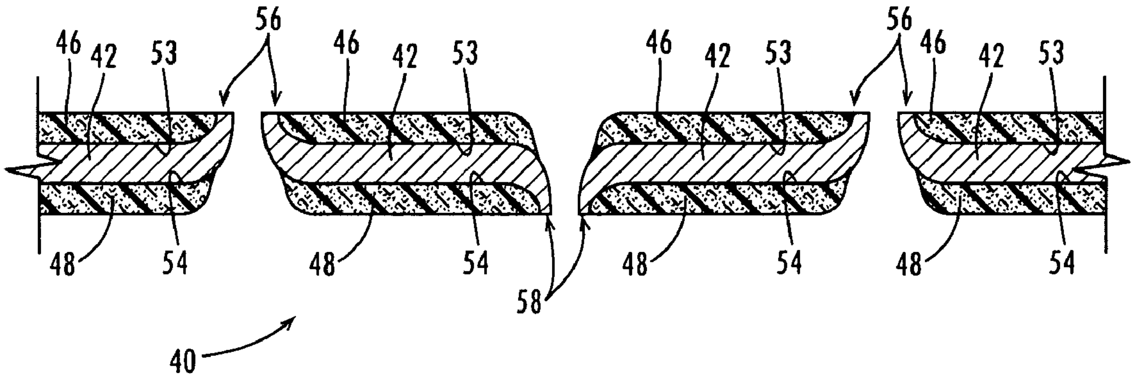
Figure 4B:
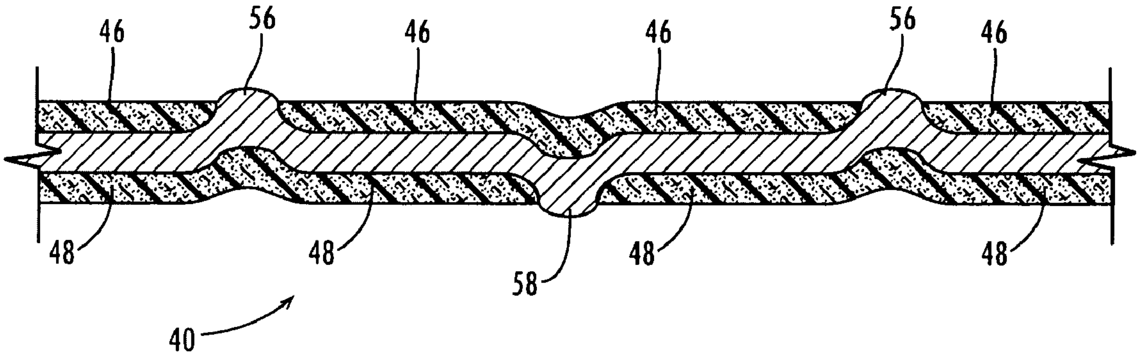
Figure 5A:
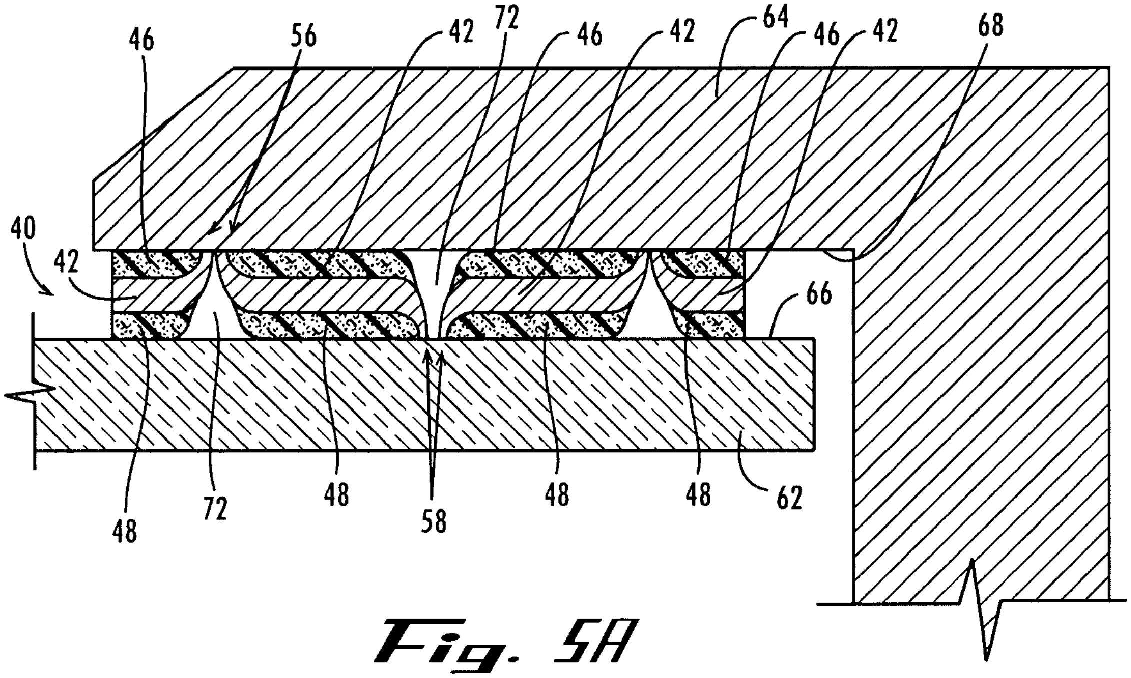
Figure 5B:
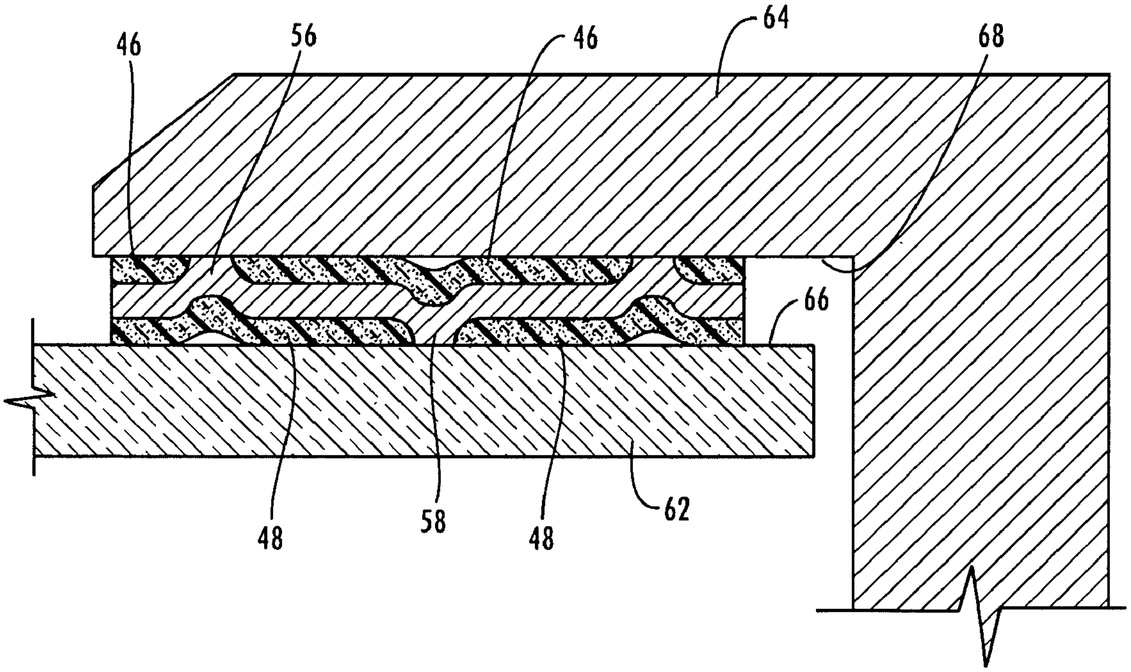

FIG. **4*a*** is a partial, cross-sectional view of an electrically conducting interface apparatus, useful as an ESD gasket, according to embodiments of the invention;

FIG. **4*b*** is a partial, cross-sectional view of an electrically conducting interface apparatus, useful as an ESD gasket, according to alternative embodiments of the invention;

FIG. **5*a* is a partial, cross-sectional view of the interface apparatus of FIG. 4*a* interfaced between a conductive display panel and its conductive support structure according to embodiments of the invention; and FIG. 5*b* is a partial, cross-sectional view of the interface apparatus of FIG. 4*b*** interfaced between a conductive display panel and its conductive support structure according to alternative embodiments of the invention.

DETAILED DESCRIPTION OF EXEMPLARY EMBODIMENTS

In the following description, like reference numerals indicate like components to enhance the understanding of the invention through the description of the drawings. Also, although specific features, configurations and arrangements are discussed hereinbelow, it should be understood that such is done for illustrative purposes only. A person skilled in the relevant art will recognize that other steps, configurations and arrangements are useful without departing from the spirit and scope of the invention.

Figure 1:
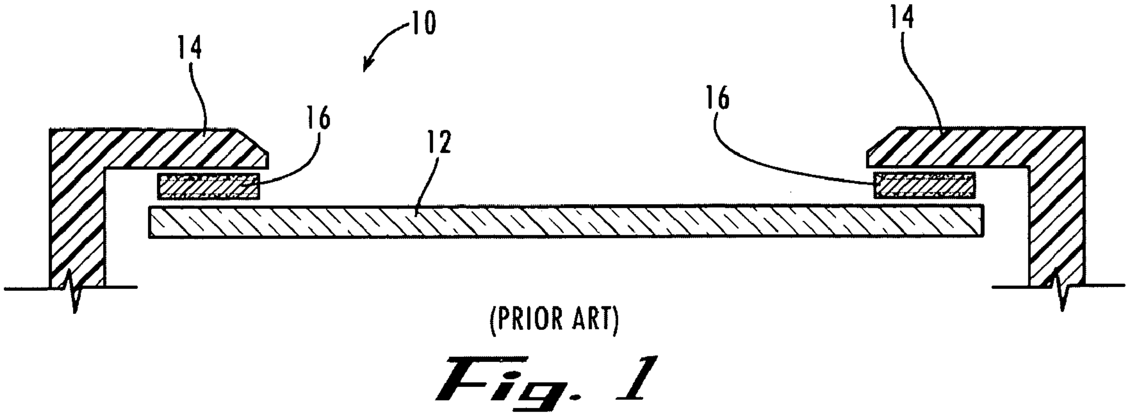
(PRIOR ART) Fig. 1
FIG. 1 is a partial, cross-sectional view of a conventional display panel and its support structure in a conventional display system.

Referring now to FIG. 1, shown is a partial, cross-sectional view of a display system 10, e.g., a display system used in avionics or in military applications. The display system 10 includes a display panel 12, a support structure or frame 14 for the display panel 12, and one or more conductive interfaces 16 coupled between surfaces of the display panel 12 and the support structure 14. The display panel 12 typically is a planar sheet of glass, or other suitably transparent material, coated with a nearly transparent coating of electrically conductive material, e.g., indium tin oxide or other suitable electrically conductive material.

The support structure or frame 14 is made of aluminum or any other suitable electrically conductive material. The support structure 14 is dimensioned and configured to provide support for the display panel 12 when the display panel 12 is attached directly or indirectly (e.g., via one or more interfaces 16) to the support structure 14.

The conductive interfaces 16 are made of a suitable electrically conductive material, and therefore provide an electrically conductive path between the display panel 12 and its support structure 14 when the conductive interfaces 16 are coupled between mating surfaces of the panel display 12 and the support structure 14. The conductive interfaces 16 function, e.g., as ESD gaskets, allowing for electrostatic discharge (ESD) from the display panel 12 to the support structure 14.

In conventional arrangements, an electrically conductive material, such as an electrically conductive epoxy or an indium-based material, is applied to the display panel 12 to effect a relatively low resistance path to the conductive coating on the display panel 12. However, the application of this additional electrically conductive material adds additional cost and process uncertainty.

Figure 2:
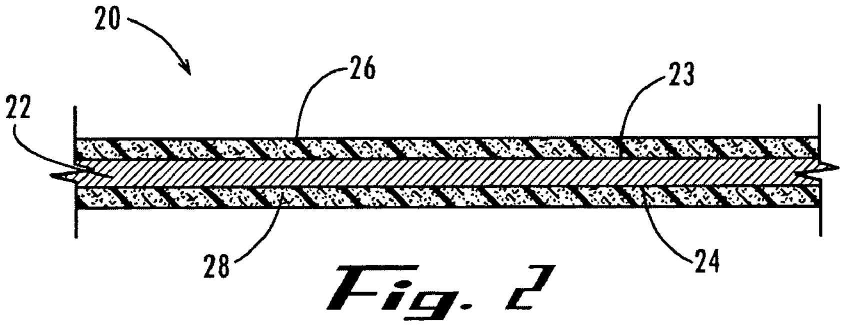
FIG. 2 is a partial, cross-sectional view of an electrically conducting interface apparatus for use as an electrostatic discharge (ESD) gasket.

Referring now to FIG. 2, shown is a partial, cross-sectional view of one type of electrically conducting interface apparatus 20 suitable for use as an ESD gasket. Such apparatus 20 is useful as a conductive interface, e.g., the conductive interface 16 shown in FIG. 1 and described hereinabove. The ESD interface apparatus (or gasket apparatus) 20 includes an electrical conductor or electrically conductive member 22, e.g., a generally flat or planar member that is made of a suitable electrically conducting material. For example, the conductive member 22 is made of commercially pure aluminum (grade 1100). A conductive member made or commercially pure aluminum has an electrical resistance of approximately 0.000001 ohm-inch. The conductive member 22 is a foil having a thickness in the range from approximately 0.002 inches to approximately 0.005 inches. The conductive member 22 has a first or top surface 23 and a generally opposing second or bottom surface 24.

Applied to the top surface 23 of the conductive member 22 is a first adhesive element 26. The first adhesive element 26 is, e.g., an electrically conductive, adhesive layer, such as a double-sided tape made of a suitable electrically conductive material or configured as a suitable electrical conductor. Such tapes include, e.g., XYZ-Axis Electrically Conductive Tape 9713, manufactured by 3M Company. Similarly, a second adhesive element 28 is adhered to the bottom surface 24 of the conductive member 22. The second adhesive element 28 is, e.g., an electrically conductive, adhesive layer, such as a double-sided tape made of a suitable electrically conductive material or configured as a suitable electrical conductor. Double-sided tapes such as 3M 9713 double-sided tape have a layer thickness, e.g., within the range between approximately 3.0 and approximately 5.0 mils (1 mil=10−3 inches), and an electrical resistance of approximately 0.01 ohm-inch.

Figure 3:
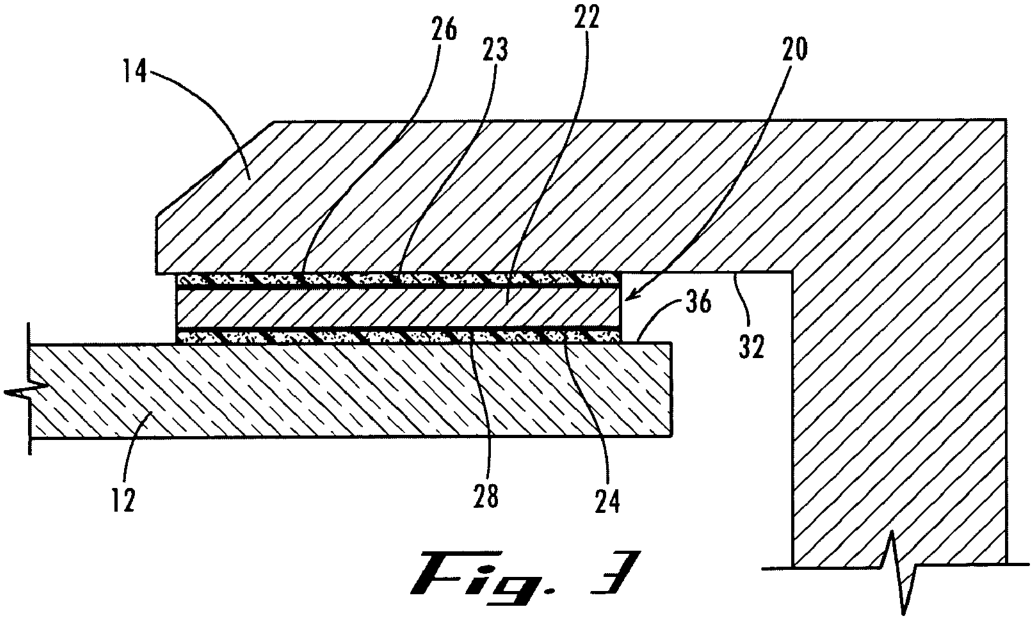
FIG. 3 is a partial, cross-sectional view of the ESD gasket of FIG. 2 interfaced between a conductive display panel and its conductive support structure.

Referring now to FIG. 3, shown is a partial, cross-sectional view of the ESD interface apparatus 20 of FIG. 2 interfaced between the conductive display panel 12 and its support frame 14. As shown, the first adhesive element 26 is adhered to the top surface 23 of the conductive member 22 and to a mating surface portion 32 of the support frame 14. Similarly, the second adhesive element 28 is adhered to the bottom surface 24 of the conductive member 22 and to a mating surface portion 36 of the display panel 12.

Typically, the first and second adhesive elements 26, 28 are the type of adhesive elements that allow for immediate, suitable adhesion to surfaces such as the top and bottom surfaces 23, 24 of the conductive member 22, the mating surface portion 36 of the panel display 12 and the mating surface portion 32 of the support frame 14. That is, the first and second adhesive elements 26, 28 typically do not require any curing or other additional processing steps for suitably adhering them to such surfaces. Also, the first and second adhesive elements 26, 28 typically do not require relatively excessive clamping force to adhere to such surfaces.

The particular arrangement of the ESD interface apparatus 20 allows the conductive member 22 to function as a substrate or a structural support or carrier for the first and second adhesive elements 26, 28. That is, the conductive member 22 provides support to the adhesive elements in a way that prevents the adhesive elements 26, 28 from tearing during fabrication, assembly or handling, or the application of the adhesive elements to the mating surface 36 of the panel display 12 and/or the mating surface 32 or the support frame 14.

The ESD interface or gasket apparatus 20 provides an electrically conductive interface path between the display panel 12 and the support frame 14. As discussed previously herein, the electrical resistance of such an interface should be as low as possible while still providing a sufficiently secure bond between the conducting surfaces, e.g., between the mating surface 36 of the display panel 12 and the mating surface 32 of the support frame 14. In the ESD gasket apparatus 20 shown in FIGS. 2 and 3, the electrical conductance path from the display panel 12 to the support frame 14 passes through the second adhesive element 28, the conductive member 22, and the first adhesive element 26. As discussed hereinabove, the resistance of the conductive member 22, when made of commercially pure aluminum, is approximately 0.000001 ohm-inch. However, the resistance of each layer of the adhesive elements is approximately 0.01 ohm-inch, which is approximately 10,000 times greater than the electrical resistance of the conductive member 22.

Therefore, it would be desirable to have a conductive interface apparatus such as an ESD gasket that provides both relatively secure bonding and relatively low electrical resistance between mating surfaces, such as between the surfaces of a conductive display panel and its supporting frame. Moreover, such an apparatus should be capable of relatively rapid assembly and application as a conductive interface, e.g., without additional assembly, processing or application steps.

According to embodiments of the invention, an apparatus is provided that is useful as an electrically conductive interface between two mating, electrically conductive surfaces. The apparatus provides a relatively low electrical resistance path between the two conductive surfaces, thus providing, e.g., ESD protection by supplying a sufficiently conductive path from one conductive surface to the other conductive surface. Also, the apparatus provides a relatively secure bond between the conductive surfaces, without additional thermal or mechanical processing steps.

Referring now to FIGS. 4*a* and 4*b*, shown is a partial, cross-sectional view of an electrically conducting interface apparatus 40 according to embodiments of the invention. The interface apparatus 40 is useful as, e.g., an ESD gasket, as will be discussed in greater detail hereinbelow. The apparatus 40 includes an electrical conductor 42, a first adhesive element 46 and a second adhesive element 48. According to embodiments of the invention, the apparatus 40 has been configured, deformed and/or agitated in such a way that portions of the electrical conductor 42 protrude through portions of the first adhesive element 46 and the second adhesive element 48. In this manner, as will be discussed further hereinbelow, the protruded portions of the electrical conductor 42 will be in electrical contact with the conductive surfaces of electrically conducting members when the interface apparatus 40 is interfaced between such electrically conducting members.

The electrical conductor 42 is made of any suitable electrically conducting material that has a sufficiently low electrical resistance. For example, the electrical conductor 42 is made of commercially pure aluminum, e.g., aluminum having a grade of 1100. As discussed previously herein, such material has an electrical resistance of approximately 0.000001 ohm-inch. Although the electrical conductor 42 can have any shape, the electrical conductor 42 typically is a foil having a thickness in the range from approximately 0.002 inches to approximately 0.005 inches, and is generally flat, planar, or sheet-like in shape, which facilitates interfacing the apparatus 40 between mating surfaces of electrically conducting members, such as the mating surfaces of conductive display panels and their conductive frames.

The first adhesive element 46 is, e.g., a double-sided tape or other suitable adhesive element for adhering to a first or top surface 53 of the electrical conductor 42. Similarly, the second adhesive element 48 is, e.g., a double-sided tape or other suitable adhesive element for adhering to a second or bottom surface 54 of the electrical conductor 42. Tapes of this kind include, e.g., XYZ-Axis Electrically Conductive Tape 9713, manufactured by 3M Company. Such tape typically has a thickness, e.g., between approximately 3.0 and approximately 5.0 mils. Although conventional adhesive elements such as XYZ-Axis Electrically Conductive Tape 9713 are electrically conductive, according to embodiments of the invention, the first and second adhesive elements 46, 48 do not have do be electrically conductive.

According to embodiments of the invention, at least one first portion (shown generally as 56) of the electrical conductor 42 protrudes through the first adhesive element 46, and at least one second portion (shown generally as 58) of the electrical conductor 42 protrudes through the second adhesive element 48. For example, according to embodiments of the invention, as shown in FIG. 4*a*, a number or apertures or perforations are formed into the interface apparatus 40 in such a manner that portions of the electrical conductor 42 protrude through the first and second adhesive element 46, 48. Alternatively, as shown in FIG. 4*b*, the interface apparatus 40 is deformed in such a way that a number of detents or other deformations of the electrical conductor 42 protrude through the first and second adhesive elements 46, 48.

The apertures, perforations, deformations and/or detents are made by any suitable processing technique. For example, according to an embodiment of the invention, the apertures are made by one or more piercing tools. It should be understood that the piercing tools typically penetrate the interface apparatus 40 from both sides, thus allowing portions of the electrical conductor 42 to protrude through both the first adhesive element 46 and the second adhesive element 48. That is, for apertures formed by piercing tools that penetrate the apparatus 40 from the side having the second adhesive element 48, portions of the electrical conductor 42 tend to protrude through the first adhesive element 46 (e.g., the protruding portions 56). Also, for apertures formed by piercing tools that penetrate the apparatus 40 from the side having the first adhesive element 46, portions of the electrical conductor 42 tend to protrude through the second adhesive element 48 (e.g., the protruding portions 58). In this manner, portions of the electrical conductor 42 protrude through both the upper and lower surfaces of the apparatus 40.

Although the apertures can have any suitable size, the portion of the piercing tools that pierces the interface apparatus 40 is sharpened and dimensioned to have a diameter of, e.g., no greater than approximately 0.010 inch. Thus, according to one embodiment of the invention, apertures formed in the interface apparatus 40 are no greater than approximately 0.010 inch in diameter.

Also, although such embodiments of the invention are not limited to the number of apertures formed in the interface apparatus 40, the number of apertures should be such that a sufficient portion of the electrical conductor 42 protrudes through the first and second adhesive elements 46, 48 in such a way that an electrically conductive path of suitably low electrical resistance is formed by the interface apparatus 40 from its first (top) surface 53 to its second (bottom) surface 54. For example, according to an embodiment of the invention, the interface apparatus 40 has approximately 30 apertures per square inch.

Similarly, according to embodiments of the invention that have a number or detents or other deformations, the detents and/or deformations are made by any suitable device or technique. Also, the detents and/or deformations are made from both sides of the interface apparatus 40, thus allowing deformed portions of the electrical conductor 42 to protrude through both the first adhesive element 46 and the second adhesive element 48.

According to embodiments of the invention, the protruding detents and/or deformations can have any suitable size, but typically they are dimensioned to be no greater than approximately 0.010 inch in diameter. Also, although not limited, the number of deformations formed in the interface apparatus 40 should be such that a sufficient portion of the electrical conductor 42 protrudes through the first and second adhesive elements 46, 48 in such a way that an electrically conductive path of suitably low electrical resistance is formed by the interface apparatus 40 from its first (top) surface 53 to its second (bottom) surface 54.

Referring now to FIGS. 5*a* and 5*b*, shown are partial, cross-sectional views of the interface apparatus 40 of FIGS. 4*a* and 4*b*, respectively, interfaced between a first electrically conductive member 62 and a second electrically conductive member 64. The first electrically conductive member 62 is, e.g., an electrically conductive display panel. The second electrically conductive member 64 is, e.g., an electrically conductive support structure or frame for the display panel. Such display panels and support frames are used in, e.g., avionics displays systems and display systems used in military applications.

According to embodiments of the invention, the interface apparatus 40 has been configured, deformed and/or agitated in such a way that portions 56 of the electrical conductor 42 protrude through portions of the first adhesive element 46 and portions 58 of the electrical conductor 42 protrude through portions of the second adhesive element 48. In this manner, when the apparatus 40 is interfaced between the first and second conducting members 62, 64, the protruding portions 56, 58 of the electrical conductor 42 make electrical contact with a mating surface 66 of the first conducting member 62 and a mating surface 68 of the second conducting member 64. More specifically, when the first adhesive element 46 is adhered to the support frame 64, the protruding portions 56 of the electrical conductor 42 make electrical contact with the mating surface 68 of the support frame 64. Similarly, when the second adhesive element 48 is adhered to the display panel 62, the protruding portions 58 of the electrical conductor 42 make electrical contact with the mating surface 66 of the display panel 62.

Without deformation of the electrical conductor 42, the electrically conductive path through the interface apparatus 40 would include the first and second adhesive elements 46, 48, as well the electrical conductor 42. As discussed hereinabove, the electrical resistance of each adhesive element is approximately 10,000 times greater than the electrical resistance of the electrical conductor 42. Accordingly, the electrical resistance of the interface apparatus 40 is greatly reduced if the conductive path therethrough does not include the adhesive element 46, 48.

Also, because of the thickness of the first and second adhesive elements 46, 48, adhering only selective portions of adhesive elements to the electrical conductor 42 still would not allow electrical contact between portions of the electrical conductor 42 and the surfaces of the first and second conducting members 66, 68. That is, the use of, e.g., double-sided adhesive strips or patches, instead of adhesive elements, such as complete layers of an adhesive element, still would not allow any portion of the electrical conductor 42 to make contact with any portion of the surface of either conducting member 66, 68 when the apparatus 40 is interfaced therebetween. Moreover, applying an entire layer of an adhesive element to the surfaces of the electrical conductor 42, rather than applying selective patches or strips, simplifies manufacturing of the apparatus and therefore is less time consuming and costly.

Therefore, according to embodiments of the invention, the interface apparatus 40 is configured, deformed and/or agitated to protrude portions 56, 58 of the electrical conductor 42 through the first and second adhesive elements 46, 48, e.g., in the manner shown in FIGS. 4*a*–*b* and 5*a*–*b*. This deformation allows the protruding portions 56, 58 of the electrical conductor 42 to make electrical contact with the surfaces of the conducting members 66, 68 when the apparatus 40 is interfaced between the conducting members 62, 64. In this manner, a relatively low electrical resistance path is established from the first conducting member 62, through the electrical conductor 42, to the second conducting member 64. The electrical path does not pass through either one of the first and second adhesive elements 46, 48, as any current such as electrostatic discharge current will pass through the least electrically resistive path.

Referring again to FIG. 5*a*, when the apparatus 40 is interfaced between conducting surfaces, e.g., the conducting members 62, 64, some of the protruding portions of the electrical conductor 42 may come in contact with each other, in addition to coming in contact with mating surface of the appropriate conducting member. For example, when the apparatus 40 is interfaced between the conducting members 62, 64, the protruding portions 56 of the electrical conductor 42 are shown contacting one another and contacting the second conducting member 64. Also, some of the protruding portions of the electrical conductor 42 may remain apart from one another as the apparatus 40 is interfaced between the conducting members 62, 64. However, such protruding portions still make electrical contact with the mating surface of the appropriate conductor. For example, such separation is shown generally by the protruding portions 58, although the protruding portions 58 still make electrical contact with the first conductor 62.

It should be understood that the contact of the protruding portions and the separation of the protruding portions are shown and described herein for illustrative purposes only, and that any of the protruding portions can be in contact with each other or remain separated at either mating surface of either conducting member. Also, it should be noted that one or more air pockets (shown generally as 72) may be formed between portions of the interface apparatus 40 and the mating surfaces of the conducting members 62, 64. However, compared to the number of protruding portions 56, 58 of the electrical conductor 42 that make electrical contact between the mating surfaces of the conducting members, any adverse effects of air pocket formation is negligible.

According to embodiments of the invention, the interface apparatus 40 provides an ESD path between conducting members that has a much lower electrical resistance than the ESD paths provided by conventional ESD gaskets or EMI gaskets. Moreover, in the inventive interface apparatus 40, because of the relatively low electrical resistance of the material of the electrical conductor 42 (e.g., commercially pure aluminum) and its particular configuration within the interface apparatus 40, electrostatic charges generally are dissipated throughout the perimeter of the electrical conductor 42 almost instantaneously, thus lessening the intensity of the discharge to the mating surface 68 of the second conducting surface 66.

Also, according to embodiments of the invention, the particular configuration of the interface apparatus 40 allows for assembly that is relatively rapid and secure. As discussed hereinabove, the use of adhesive elements in the inventive interface apparatus 40 does not require additional thermal processing steps or mechanical fixation techniques. Also, the inventive interface apparatus 40 provides suitable weather sealing between the display panel and its support frame.

In testing, the inventive interface apparatus 40 according to embodiments of the invention was successful in dissipating approximately 15,000 volts that were applied to the surface of the conductive display panel. Also, like many conventional ESD/EMI gaskets, the interface apparatus 40 according to embodiments of the invention meets the requirements of various test standards, e.g., tests for electromagnetic interference (EMI), humidity and mechanical shock. Such standards include, but are not limited to:

FAA standards—RTCA/D0-160D and subsequent revisions;

MILITARY standards—

MIL-STD-810E and subsequent revisions;

MIL-STD-1686C and subsequent revisions;

MIL-STD-454N and subsequent revisions;

MIL-STD-883E and subsequent revisions;

ANSI—ANSI C63 and subsequent revisions;

EN—EN 61340 and subsequent revisions;

ISO—ISO 10605 and subsequent revisions; and

IEC—IEC 61000 and subsequent revisions.

It will be apparent to those skilled in the art that many changes and substitutions can be made to the embodiments of the invention herein described without departing from the spirit and scope of the invention as defined by the appended claims and their full scope of equivalents. For example, although the circuit components are described hereinabove as an integrated circuit or part of an integrated circuit, the various circuit components alternatively can be discrete components arranged and coupled together to form the various circuits shown and described.

I claim:

1. An apparatus for providing protection from electrostatic discharge (ESD), the apparatus providing an electrical conductance path between a first electrically conductive member and a second electrically conductive member, the apparatus comprising:

an electrical conductor having a first surface and a generally opposing second surface;

a first adhesive element for adhering at least a portion of the first surface of the electrical conductor to at least a portion of the first member; and a second adhesive element for adhering at least a portion of the second surface of the electrical conductor to at least a portion of the second member, wherein the electrical conductor is configured in such a way that at least a portion of the first surface of the electrical conductor is in electrical contact with the first member and at least a portion of the second surface of the electrical conductor is in electrical contact with the second member with the apparatus being adhered between the first member and the second member.

2. The apparatus as recited in claim 1, wherein at least a portion of the electrical conductor protrudes through at least a portion of the first adhesive element and through at least a portion of the second adhesive element.

3. The apparatus as recited in claim 1, the apparatus has at least one aperture formed therein to protrude a portion of the electrical conductor through at least a portion of the first adhesive element and through at least a portion of the second adhesive element.

4. The apparatus as recited in claim 3, wherein the at least one aperture has a diameter that is less than or equal to approximately 0.010 inch.

5. The apparatus as recited in claim 1, wherein at least a portion of the apparatus has approximately 30 apertures per square inch formed therein to protrude a portion of the electrical conductor through at least a portion of the first adhesive element and at least a portion of the second adhesive element.

6. The apparatus as recited in claim 1, wherein the electrical conductor is an aluminum alloy having an electrical resistance of approximately 0.000001 ohm-inch.

7. The apparatus as recited in claim 1, wherein the electrical conductor is commercially pure aluminum having a grade of 1100.

8. The apparatus as recited in claim 1, wherein at least one of the first and second adhesive elements is an electrically conductive, double-sided tape.

9. A display, comprising:

an electrically conductive display panel;

at least one electrically conductive support structure; and at least one electrically conductive interface coupled between portions of the conductive display panel and the at least one support structure, wherein the at least one conductive interface includes an electrical conductor having a first surface and an opposing second surface, a first adhesive structure having a first side adhered to at least a portion of the first surface of the electrical conductor, and a second side adhered to at least a portion of the first member, and a second adhesive structure having a first side adhered to at least a portion of the second surface of the electrical conductor, and a second side adhered to at least a portion of the second member, wherein the electrical conductor is configured in such a way that at least a portion of the first surface thereof is in electrical contact with the first member when the second side of the first adhesive structure is adhered to the first member and at least a portion of the second surface thereof is in electrical contact with the second member when the second side of the second adhesive structure is adhered to the second member.

10. The display as recited in claim 9, wherein the conductive interface comprises an electrostatic discharge (ESD) gasket for discharging static electricity from the display panel to the support structure.

11. The display as recited in claim 9, wherein at least a portion of the electrical conductor extends through at least a portion of the first adhesive structure and the second adhesive structure.

12. The display as recited in claim 9, wherein the apparatus has at least one aperture formed therein to protrude a portion of the electrical conductor through at least a portion of the first adhesive structure and the second adhesive structure.

13. The display as recited in claim 9, wherein at least a portion of the electrical conductor has approximately 30 apertures per square inch formed therein to protrude a portion of the electrical conductor through at least a portion of the first adhesive structure and the second adhesive structure.

14. The display as recited in claim 9, wherein the electrical conductor is generally planar.

15. A method for providing electrostatic discharge (ESD) protection by providing an electrical conductance path between a first conductive member and a second conductive member, the method comprising the steps of:

providing at least one conducting interface, the conducting interface including an electrical conductor having a first surface and a generally opposing second surface, a first adhesive element having a first side attached to at least a portion of the first surface of the electrical conductor, and a generally opposing second side, and a second adhesive element having a first side attached to at least a portion of the second surface of the electrical conductor, and a generally opposing second side;

deforming at least a portion of the electrical conductor through at least a portion of the first adhesive element and at least a portion of the second adhesive element; and coupling the conducting interface between the first conductive member and the second conductive member in such a way that the first surface of the electrical conductor is in electrical contact with the first conductive member and the second surface of the electrical conductor is in contact with the second conductive member.

16. The method as recited in claim 15, wherein the deforming step comprises forming at least one aperture in the conducting interface, wherein at least a portion of the electrical conductor protrudes through the first adhesive element and through the second adhesive element.

17. The method as recited in claim 15, wherein the deforming step further comprises piercing the conducting interface in such a way that at least a portion of the electrical conductor protrudes through the first adhesive element and through the second adhesive element.

18. The method as recited in claim 15, wherein the deforming step further comprises forming approximately 30 apertures per square inch in the conducting interface.

19. The method as recited in claim 15, wherein the coupling step further comprises adhering the second side of the first adhesive element to the first conductive member and adhering the second side of the second adhesive element to the second conductive member.

* * * * *